United States Patent [19]

Stern

[11] Patent Number: 6,015,482

[45] Date of Patent: Jan. 18, 2000

[54] PRINTED CIRCUIT MANUFACTURING PROCESS USING TIN-NICKEL PLATING

[75] Inventor: Theodore R. Stern, Minneapolis, Minn.

[73] Assignee: Circuit Research Corp., Delano, Minn.

[21] Appl. No.: 08/993,389

[22] Filed: Dec. 18, 1997

[51] Int. Cl.[7] .................................................. C25D 5/02
[52] U.S. Cl. ......................................................... 205/125
[58] Field of Search ..................................... 205/118, 125

[56] References Cited

U.S. PATENT DOCUMENTS

| | | | |
|---|---|---|---|
| 3,772,168 | 11/1973 | Dillenberg | 204/43 |
| 3,887,444 | 6/1975 | Fueki et al. | 204/43 S |
| 4,033,835 | 7/1977 | Lerner et al. | 204/43 S |
| 4,049,508 | 9/1977 | Morrissey | 204/43 S |
| 4,081,336 | 3/1978 | Eppensteiner et al. | 204/55 Y |
| 4,088,545 | 5/1978 | Supnet | 204/15 |
| 4,104,111 | 8/1978 | Mack | 156/656 |
| 4,283,248 | 8/1981 | Kakuhashi et al. | 156/637 |
| 4,368,252 | 1/1983 | Kakuhashi et al. | 430/312 |
| 4,640,747 | 2/1987 | Ueno et al. | 204/37.1 |
| 4,666,739 | 5/1987 | Roubal | 427/97 |
| 4,828,657 | 5/1989 | Fukuoka et al. | 204/44.4 |
| 4,946,563 | 8/1990 | Yeatts | 204/15 |
| 5,232,575 | 8/1993 | Dodd | 205/238 |
| 5,320,919 | 6/1994 | Azuma et al. | 428/546 |
| 5,403,465 | 4/1995 | Apperson et al. | 205/77 |
| 5,536,908 | 7/1996 | Etchells | 174/257 |

OTHER PUBLICATIONS

Copy of PCT International Search Report mailed on Mar. 18, 1999 (4 pages).

*Primary Examiner*—Kathryn Gorgos
*Assistant Examiner*—Erica Smith-Hicks
*Attorney, Agent, or Firm*—Dicke, Billig & Czaja, P.A.

[57] ABSTRACT

A process for manufacturing a printed circuit that replaces tin and/or tin-lead electroplating with tin-nickel based electroplating. The process includes printing a desired circuitry pattern onto a resist-coated copper-clad substrate. A tin-nickel material is electroplated onto the desired circuitry pattern, and the resist removed. The tin-nickel electroplating takes place within a bath comprised of a nickel source, a stannous source and a starter solution including a bifluoride salt, diethylenetriamine and triethylenetetramine.

15 Claims, 3 Drawing Sheets

PRINTED CIRCUIT MANUFACTURING PROCESS USING TIN-NICKEL PLATING

BACKGROUND OF THE INVENTION

The present invention relates to an improved printed circuit manufacturing process. More particularly, it relates to a process for manufacturing a printed circuit incorporating tin-nickel plating.

The electronics industry has expanded dramatically over the last several decades, in terms of types of product available and their functional capabilities. Printed circuit technology has been, and continues to be, a vital catalyst for this expansion. Each year, new electronic products are introduced, and previously-existing ones are improved. Virtually every one of these electronic products, including computers, telephones, calculators, etc., includes a printed circuit.

The requirements placed on printed circuit capabilities have increased greatly in conjunction with the constant demand for improved electronics technology. Multilayer printed circuits having literally thousands of circuitry traces and connectors are now commonplace. Additionally, as electronic products continue to become smaller in size, the printed circuit associated with the individual product must also decrease in size, resulting in tighter manufacturing tolerances. Even further, printed circuit manufacturers are now being asked to produce larger volumes of identical printed circuits within shorter turnaround times. To accommodate these requirements, the manufacturing techniques associated with printed circuits have evolved.

In addition to providing dense, high performance printed circuits, today's printed circuit fabrication industry must remain cognizant of environmental concerns. It is not enough to simply manufacture a printed circuit having increased capabilities; the manufacturing process itself must be environmentally safe. For example, intricate waste treatment systems have been developed in an attempt to minimize the environmental impact of hazardous waste inherently associated with printed circuit fabrication.

Finally, to remain competitive, printed circuit manufacturers must keep fabrication costs as low as possible. This is an extremely difficult task, given that printed circuit manufacturing entails a number of independent processing steps, as described in greater detail below. Each individual process includes its own associated costs, such as, for example, requiring the specialized waste treatment system mentioned above.

Generally speaking, the above stated goals of increased capabilities along with reduced environmental hazards and costs are inherently opposed. Standard manufacturing techniques require the use of hazardous chemicals, such as acids and oxidizers. In addition, lead-based solder has heretofore been an integral component of the printed circuit manufacturing process. For example, a typically employed printed circuit manufacturing process begins with a non-conductive substrate covered with a copper foil layer. A resist (or plating resist) is applied to the copper foil. A film (or artwork) containing an image of a desired circuitry pattern is associated with the resist-covered copper surface and exposed to a light source. Subsequently, the board is passed through a "developing" process to selectively remove some of the resist from the board. More particularly, following developing, resist is removed from the desired circuitry pattern, but encompasses the remainder of the board surface. In other words, the desired circuitry pattern no longer has any resist, such that the copper foil surface is exposed. The remainder of the copper foil, however, remains coated with the resist material.

The board is processed through an electroplating process by which additional copper is electroplated to the exposed circuitry pattern. Any areas covered by resist are not plated with copper. Thus, the exposed circuitry pattern is "plated up" with additional copper.

Tin or tin-lead (or solder) is electroplated over the previously-plated copper. Once again, the resist prevents any of the tin or tin-lead material from plating to any board surface covered with the resist. Following the tin or tin-lead electroplating process, then, the desired circuitry pattern is defined by the previously-plated copper and a layer of tin or tin-lead. The remainder of the board otherwise covered with resist does not have additional material plated to the copper foil surface. In this regard, the tin or tin-lead serves as a barrier to prevent subsequent etching of the desired circuitry pattern and acts as a protective coating on the plated copper to prevent oxidation.

The board is then processed through a "stripping" procedure during which the resist is stripped away (or removed) from the board surface. With the resist removed, the copper foil previously covered by the resist is now exposed.

The board is then subjected to an "etching" process. The etching process acts to etch or remove copper from the surface of the board not otherwise protected by the tin or tin-lead material. Any copper foil not covered is entirely etched from the substrate surface. As a result, the desired circuitry pattern, defined by copper foil, electroplated copper, and a tin or tin-lead layer, remains adhered to the laminant surface. All other copper, however, is now removed. Where tin-lead (or solder) is used as the etch resistant, the tin-lead is then cleaned in a conditioner and a flux. Following this processing, the solder is "reflowed" using infrared heat or "hot oil". The reflowed solder forms a protective alloy over the entire copper trace.

Alternatively, with a fabrication method referred to as Solder Mask Over Bare Copper (SMOBC), tin (as opposed to tin-lead) is used as the etch resistant. With this technique, following etching, the tin material is stripped (or removed) from the circuitry pattern. As a result, the desired circuitry pattern is in the form of plated copper traces adhered to the substrate.

A solder mask is then applied to the board as a protective coating for the various copper traces. In particular, the solder mask is coated on the board in a predetermined pattern, leaving selected areas of the circuitry pattern unprotected (or "bare"). Following application of the solder mask, the board is treated with a substance, most commonly solder, which adheres to any areas not covered by the solder mask. One such solder application technique is referred to as Hot Air Leveling (HAL) in which the board is immersed in a molten solder bath of 63% tin and 37% lead. Excess solder is removed from the board and any previously drilled holes by forced air. An additional goal of the HAL process is to "level" the solder that remains adhered to selected portions of the circuitry pattern. In theory, the leveling process results in a flat surface for subsequent surface mount technology (SMT) applications. In practice, however, HAL cannot produce a perfectly planar surface. HAL oftentimes results in a "crown"-like surface, hindering proper chip SMT placement. Even with a relatively flat HAL-produced surface, chip SMT application requires a wave solder step to secure the chip or other component to the board surface. Wave soldering, while widely accepted, may result in undesired chip migrations as the solder liquifies.

It should be noted that recently, efforts have been made to replace the solder-hot air leveling process with the use of a clear organic polymer, an immersion tin, or an immersion/electroless palladium material placed over the copper. These processes have not been proven to eliminate the above-described problems, and instead add an additional manufacturing step (with additional costs).

A subsequent procedure sometimes employed in printed circuit fabrication is plating nickel and gold to select areas of the circuitry pattern, such as surface mount pads and/or tabs. With this application, solder or tin is first selectively stripped and the underlying copper cleaned. Nickel is then electroplated to desired areas of the printed circuits followed by gold electroplating. Electroplating of nickel is required to prevent "migration" of copper into the electroplated gold. Basically, the layer of electroplated nickel acts as a metallic barrier, thereby preventing copper migration. The migration of copper into gold is undesirable, as copper reduces the anti-corrosive properties of gold, which is essential to the integrity of printed circuit contacts, requiring exposed conductive leads, such as keypads and contact tabs.

The printed circuit fabrication process has been described above in very basic terms. It should be clear, however, that printed circuit manufacturing is quite complex. Boards are subjected to a wide variety of chemical solutions and mechanical processing, many resulting in formation of waste materials. Additionally, each process step inherently increases overall production costs, along with presenting a greater opportunity for error. Finally, several of the processing steps subject the board to possible long-term damage. For example, HAL subjects a board to extreme thermal shock.

Printed circuits continue to be an integral part of the evolution of the electronics industry. To this end, any technique able to maintain or even improve board integrity and performance while eliminating process steps, costs and hazardous waste is highly desirable. Therefore, a substantial need exists for a printed circuit manufacturing process with reduced steps, costs and waste.

SUMMARY OF THE INVENTION

The present invention provides an improved method for manufacturing a printed circuit, utilizing a tin-nickel based electroplating bath in place of tin or tin-lead. The method includes providing a board defined by a substrate having at least one surface coated with a copper foil. A circuitry pattern is printed onto the copper-coated surface such that the circuitry pattern is defined by exposed copper, whereas the remainder of the board is coated with a resist material. A tin-nickel material is electroplated to the exposed copper surfaces. The resist material is stripped from the board. Finally, any copper not covered by the previously plated tin-nickel material is etched from the substrate surface, thereby leaving a circuitry pattern in the form of various copper traces each having an outer surface covered with tin-nickel. In one preferred embodiment, an immersion coating of tin is deposited along side walls of the copper traces and a solder mask is applied over selected areas of the board. In an alternative embodiment, an additional layer of copper is electroplated to the circuitry pattern prior to tin-nickel plating. Notably, because the circuitry pattern has been plated with tin-nickel, subsequent gold plating at selective locations can be achieved with a single processing step.

The above-described tin-nickel electroplating is accomplished without the use or production of hydrofluoric acid as an electrolyte. In particular, the method preferably makes use of a tin-nickel plating solution comprised of nickel fluoborate, stannous fluoborate and a brightener solution. In a preferred embodiment, the brightener solution consists of a bifluoride salt, diethylenetriamine and triethylenetetramine. This unique plating solution is configured to plate a tin-nickel material onto exposed copper without the creation of hydrofluoric acid otherwise found with standard tin-nickel plating techniques, and by elimination of chloride as an electrolyte, produces a more ductile deposit. In one alternative embodiment, the tin-nickel plating solution further includes a silicone glycol copolymer. In another alternative embodiment, a tin-nickel-cobalt material is plated. The tin-nickel bath of the present invention can be maintained within proper operating parameters through the use of a buffer solution preferably consisting of diethylenetriamine, triethylenetetramine and ammonium carbonate. Additionally, a bath replenisher preferably consisting of a bifluoride salt and an ethyleneamine mixture is also envisioned.

DETAILED DESCRIPTION OF THE INVENTION

Figure 1:
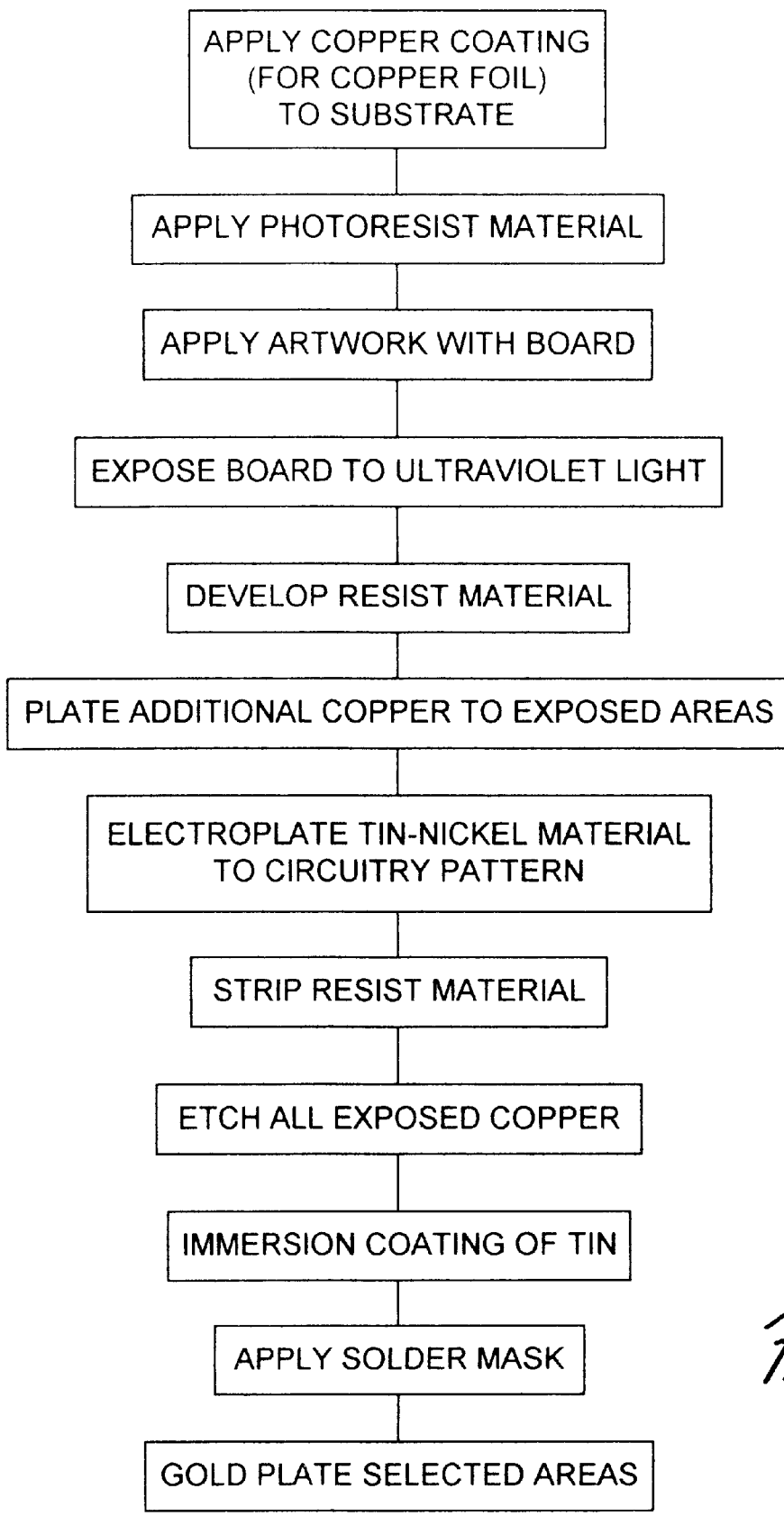
FIG. 1 is a table showing the sequence of steps for manufacturing a printed circuit in accordance with the present invention.

FIG. 1 provides a step-by-step explanation of a printed circuit manufacturing technique in accordance with the present invention. In conjunction with this explanation, FIGS. 2A–2H present an operational view of the steps associated with the present invention with reference to a portion of a printed circuit. Notably, for ease of illustration, FIGS. 2A–2H depict a magnified view of the printed circuit.

Figure 2A:
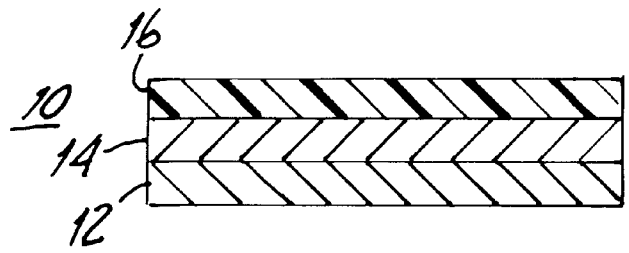
FIGS. 2A–2H depict cross-sectional views of a representative part of a printed circuit at various stages of processing in accordance with the present invention.

With reference to FIG. 2A, manufacturing of a printed circuit board 10 in accordance with the present invention begins similar to most other commonly used techniques. Namely, a laminant substrate 12 is first provided. The laminant substrate 12 is normally made of a nonconductive material, such as epoxy-glass. The laminant substrate 12 is coated with a copper foil layer 14. The copper foil layer 14 is adhered to at least one outer surface of the laminant substrate 12, but may encompass both sides of the laminant substrate 12. In some instances, the combination of the laminant substrate 12 and the copper foil layer 14 is pre-assembled by an outside source, the resulting product referred to as a "copper-clad laminant".

The board 10 is then drilled in accordance with a predetermined pattern, such as by a C-N-C drilling machine. In particular, variously sized holes are imparted through the board 10 at a variety of locations, in the exact configuration of a desired hole pattern for the printed circuit. For ease of illustration, FIGS. 2A–2H do not show any of the holes.

Following drilling, an outer surface of the copper foil layer 14 is coated with a resist material 16. The resist material 16 is preferably a photopolymer plating resist solution well-known in the art, and is normally light sensitive.

A photographic film image or artwork (not shown) of a desired circuitry pattern is then associated with the board 10. In particular, the artwork provides a picture or image of various circuitry traces and is properly designed to selectively prevent light from passing through portions of the film. For example, with one well-known technique, the circuitry pattern is presented on the film in the form of an emulsion material which prevents the passage of light. The remainder of the film, where no circuitry is desired, is clear.

With the artwork in place, the board 10 is "exposed". For example, the board 10 and associated artwork are subjected to ultraviolet light. As previously described, the artwork is designed to selectively allow and/or prevent passage of other ultraviolet light at desired locations. For example, where the artwork forms desired circuitry traces with an emulsion material, ultraviolet light will not pass through the emulsion. However, where the film is clear, the ultraviolet light will pass. The resist material 16 is normally configured to "cure," harden or otherwise react in response to exposure to ultraviolet light such that it is impervious to developer chemistry. At locations on the board 10 where ultraviolet light is prevented from reaching the resist material 16 (i.e., the desired circuitry pattern), the resist material 16 will not cure, such that it will be attacked by developer chemistry.

Figure 2B:
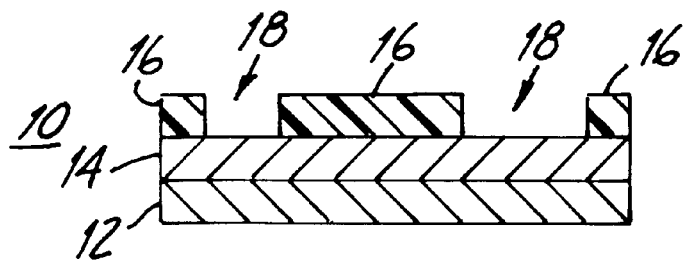

The board 10 is then "developed". With this commonly-used technique, any resist material 16 not cured during exposure is removed from the board 10. As shown in FIG. 2B, then, following developing, a circuitry pattern 18 is defined on the board 10. Once again, the resist material 16 has been removed from the desired circuitry pattern 18, thereby exposing the copper foil layer 14. The circuitry pattern 18 is defined by the copper foil layer 14 not otherwise covered by the resist material 16.

Figure 2C:
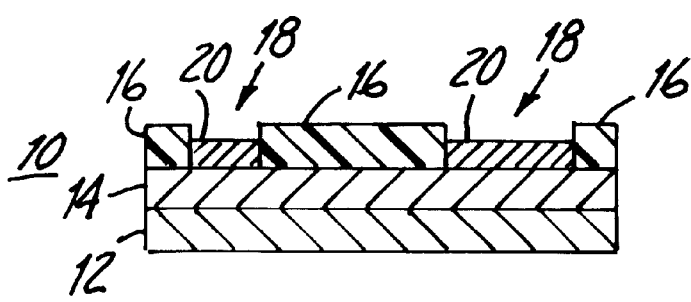

The board 10 is then preferably processed through a copper electroplating line. Prior to actual copper plating, the board 10 may be cleaned and otherwise prepared to receive additional copper material. Following preparation of the board 10, an electrolytic copper layer is deposited onto the circuitry pattern 18 via an energized copper-based plating bath, such as sulfuric acid/copper sulfate. During the copper electroplating process, the resist material 16 resists or shields copper from plating to certain areas of the board 10. In other words, as shown in FIG. 2C, electroplated copper 20 is deposited only on exposed portions of the copper foil layer 14, such that only the desired circuitry pattern 18 receives the electroplated copper 20.

Figure 2D:
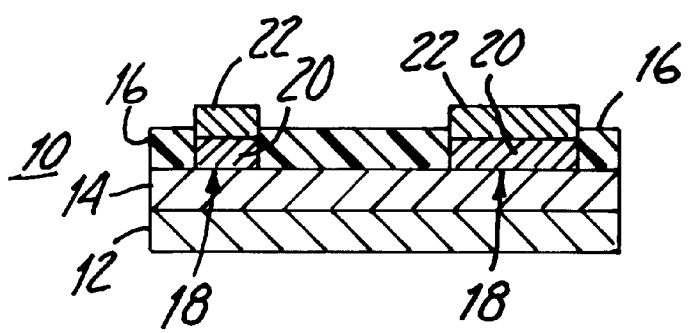

The board 10 is then passed through a tin-nickel electroplating process. Similar to the copper electroplating procedure described above, the tin-nickel electroplating process may include subjecting the board 10 to various preliminary solutions to clean and otherwise prepare the board 10 for receiving the electroplated tin-nickel. During the actual electroplating activity, the resist material 16 again resists the deposit of tin-nickel on to portions of the copper foil layer 14 otherwise coated with the resist material 16. Conversely, the electroplated copper 20 previously plated will receive and maintain tin-nickel. Therefore, as shown in FIG. 2D, following the tin-nickel electroplating procedure, a layer of tin-nickel 22 is adhered to the electroplated copper 20. As a result, the desired circuitry pattern 18 is now defined by the copper foil layer 14, the electroplated copper 20 and the tin-nickel layer 22. Importantly, the tin-nickel layer 22 serves as a barrier to prevent subsequent etching of the circuitry pattern 18 and as a protective coating on the electroplated copper 20 to prevent oxidation. In an alternative embodiment, a layer of tin-nickel-cobalt is instead electroplated to the board 10 in a similar manner.

Figure 2E:
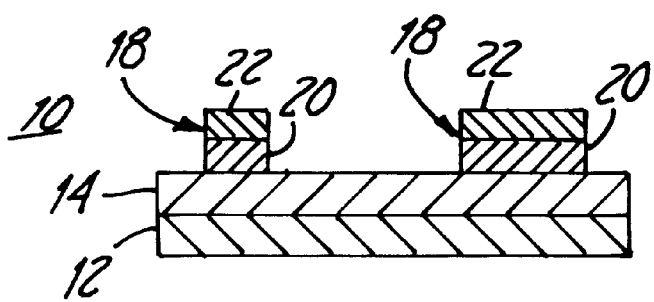

The board 10 is then subjected to a "stripping" process in which the resist material 16 is "stripped" or removed from the copper foil layer 14. FIG. 2E depicts the board 10 following the resist stripping process. As shown in FIG. 2E, all of the resist material 16 has been removed, so as to expose the copper foil layer 14. Importantly, the resist stripping process does not affect the tin-nickel layer 22 (or, alternatively, the tin-nickel-cobalt layer), the electroplated copper 20 or the copper foil layer 14. A commonly used resist stripping solution is comprised of an ethanolamine, such as monoethanolamine, and/or additional alkaline components including potassium or sodium hydroxide, tetramethyl ammonium hydroxide, or the like, but many other types are available and would be obvious to one of skill in the art.

Figure 2F:
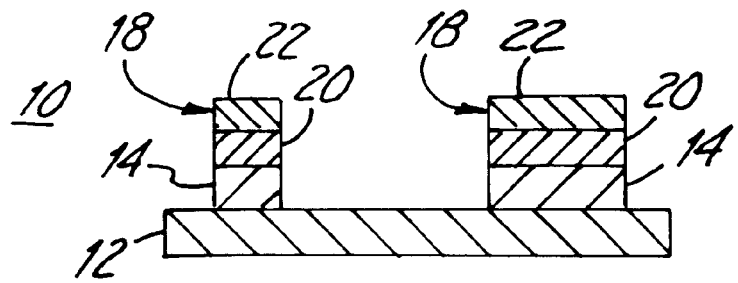

The board 10 is processed through an "etching" line. In particular, the copper foil layer 14 not otherwise encompassed by the tin-nickel layer 22 is "etched" or removed from the laminant substrate 12 as shown in FIG. 2F. The tin-nickel layer 22 is resistant to the etchant solution such that the tin-nickel layer 22 (or, alternatively, the tin-nickel-cobalt layer), and the electroplated copper 20 and the copper foil layer 14 directly beneath the tin-nickel layer 22, is not removed during etching. Once again, the board 10 may be immersed in a cleansing bath or other preparatory solution prior to actual etching. In a preferred embodiment, an ammonium hydroxide or ammonium chloride solution is used as a copper etchant, although other commonly used solutions are equally acceptable. Following etching, all copper is removed from the board 10 other than at the desired circuitry pattern 18.

Figure 2G:
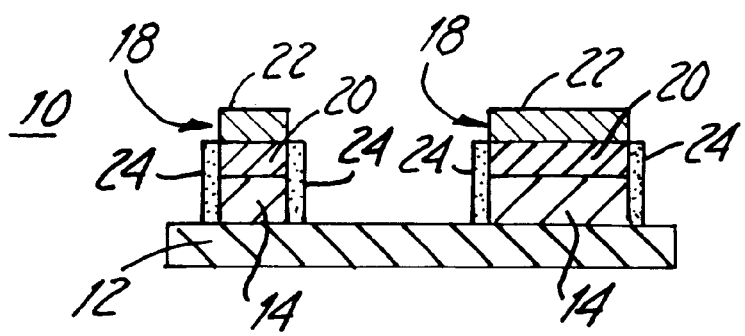

In a preferred embodiment, the board 10 is then processed through a tin coating process in which a tin or tin alloy 24 is coated along side walls of the remaining copper foil layer 14 and the electroplated copper 20, as shown in FIG. 2G. Similar to the previously-described processes, the tin coating procedure may include various cleaning and other preparatory steps, such as immersing the board 10 in an acid dip. Regardless of the exact procedure, however, the coating of tin or tin alloy 24 adheres to the side walls of the circuitry pattern 18, thus offering complete protection for subsequent processing and board applications.

Figure 2H:
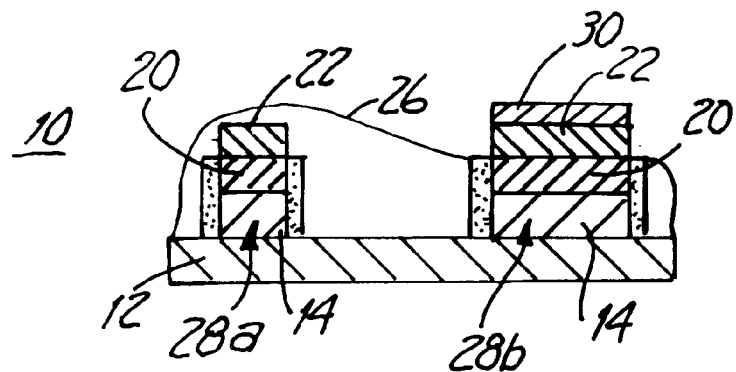

A solder mask 26 is then applied to the board 10 as shown in FIG. 2H. Solder mask solutions are well-known in the art, sold, for example, by Dupont, and generally serve to prevent accidental solder connections (or "bridging") between the desired circuitry pattern 18 from occurring. Importantly, as shown in FIG. 2H, the solder mask 26 can be selectively applied to the board 10 such that select portions of the circuitry pattern 18 are not entirely encompassed by the solder mask 26. For example, FIG. 2H shows a first and second circuitry trace 28a and 28b of the desired circuitry pattern 18. The first circuitry trace 28a is covered by the solder mask 26, whereas the second circuitry trace 28b is uncovered or "bare". This desired application of the solder mask 26 is done to prepare identified areas (such as the second circuitry trace 28b or "pad") for subsequently receiving various electrical components during SMT.

An additional procedure sometimes used in the fabrication of a printed circuit is to apply a gold material to selected areas of the board 10. The solder mask 26 is designed to resist depositing of gold. Conversely, gold will adhere to the tin-nickel layer 22. The gold depositing process normally includes "activating" the tin-nickel layer 22 in a diluted acid bath. Subsequently, the board 10 is at least partially immersed in a gold bearing bath. Once again, the gold material 30 will adhere to the tin-nickel layer 22, not otherwise encompassed by the solder mask 26.

The above-described fabrication method is vastly different from techniques presently employed by printed circuit manufacturers. In particular, the above-described process eliminates the steps of tin and/or solder plating, stripping, solder conditioning and subsequent hot oil or infrared reflow and hot air leveling. Additionally, previously-used gold plating techniques require an additional step of depositing a nickel layer at desired locations. Because the tin-nickel layer 22 has previously been applied as an etch resistant, there is no need to subject the board 10 to this additional step. As a result, another processing step (and its related costs) normally required by printed circuit manufacturing is eliminated. Importantly, because the above-described method does not require the use of solder stripping or hot air leveling, no lead-bearing waste is produced.

As should be evidenced from the above description, the focus of the present invention is upon the use of a tin-nickel electroplating process step in place of tin or tin-lead normally used. In this regard, the tin-nickel electroplating step includes depositing a tin-nickel material consisting of 10–60% nickel and 40–90% tin, preferably 20–50% nickel and 50–80% tin; and most preferably 35% nickel and 65% tin. In an alternative embodiment, tin-nickel-cobalt is instead electroplated. The tin-nickel-cobalt electroplating step includes depositing a tin-nickel-cobalt material consisting of 5–30% nickel, 5–30% cobalt and 40–90% tin; preferably 10–25% nickel, 10–25% cobalt and 50–80% tin; and most preferably 17.5% nickel, 17.5% cobalt and 65% tin.

In one preferred embodiment, the preferred tin-nickel plating bath is comprised of approximately 25–35%, preferably 30.7%, deionized water; approximately 30–40%, preferably 34.7%, electroless grade liquid nickel fluoborate; approximately 10–20%, preferably 14.6%, stannous fluoborate; and 15–25%, preferably 20%, of a plating starter solution. From the above constituents, it should be noted that tin sources other than liquid stannous fluoborate, which is relatively inexpensive, are available. For example, liquid stannous chloride or stannous sulfate may also be used.

As previously described, an alternative embodiment of the present invention electroplates a tin-nickel-cobalt material. In this regard, the preferred tin-nickel-cobalt bath is comprised of approximately 25–35%, preferably 30.7%, deionized water; approximately 30–40%, preferably 34.7%, electroless grade liquid nickel fluoborate; approximately 5–10%, preferably 7.3%, stannous fluoborate; approximately 5–10%, preferably 7.3%, cobalt fluoborate; and approximately 15–25%, preferably 20%, of a plating starter solution.

In one preferred embodiment, the plating starter solution consists of 1–20% of a bifluoride salt, preferably ammonium bifluoride; 1–10% diethylenetriamine; and 1–10% triethylenetetramine. The starter solution can be used with both tin-nickel plating and tin-nickel-cobalt plating.

During use, an appropriate volume of the preferred tin-nickel plating bath is formulated in accordance with the above parameters. In one example, 30.7 gallons of deionized water was poured into a tank and heated to 140° F. 34.7 gallons of liquid nickel fluoborate was then added and mixed. Subsequently, 14.6 gallons of liquid stannous fluoborate was added, and the bath mixed thoroughly. 20 gallons of the above-described starter solution was then added and mixed. The bath was filtered until completely clear, and dummy plating was performed for one hour at 5 ASF. Actual plating then occurred with the bath at a temperature range of 120–175° F., preferably 125° F.; with a cathode current density of 1–30 ASF, preferably 10–25 ASF; at a pH of 4.2–4.8, preferably 4.5; with a nickel fluoborate concentration of 240–330 g/L, preferably 250 g/L; and a stannous fluoborate concentration of 45–60 g/L, preferably 50 g/L.

Tests run using the above-described process and tin-nickel plating bath have shown exceptional results. A plating rate of 0.5 microns at 25 ASF was achieved. The tin-nickel electroplated material was bright, compatible with standard photopolymer plating resists, and was fully functional as an etch resistant without cosmetic degradation when subjected to an ammonium hydroxide/ammonium chloride etchant. The tin-nickel deposit was highly solderable and was amenable to solder mask adhesion.

It should be readily apparent to one of ordinary skill that different printed circuits will require different plating thickness and quality. The present invention can accommodate these varying applications by, for example, use of a different ASF. Even further, while the above example was performed using nickel fluoborate and stannous fluoborate, other nickel and stannous sources (some of which have been listed above) are also readily available. For example, nickel chloride and stannous chloride, in amounts equal to that described in the example, have produced acceptable plating results.

Similarly, one of ordinary skill will readily recognize that the above-described ratios apply to the tin-nickel-cobalt plating bath. Once again, different stannous, nickel and cobalt sources are readily available and will produce acceptable plating results.

As should be noted from the above, the preferred bath does not utilize fluoride as a complexing agent for the nickel or as a stabilizing agent for tin. Therefore, plating with the above-described bath does not result in the production of hydrofluoric acid.

Prior to submersing a board or boards within the tin-nickel plating bath, the board is preferably subjected to various preparatory steps. More particularly, in the preferred embodiment, the board is immersed in a 10% by volume solution of fluoboric acid and water for five minutes at ambient temperature. The board(s) is then rinsed in a continuously flowing deionized water rinse for five minutes at ambient temperature. The board(s) is then placed in a pre-plating solution consisting of 80% water and 20% plating starter solution (as described above). Following the pre-dip procedure, the board is placed into the tin-nickel plating bath for subsequent plating.

Over time, it may become necessary to replenish the tin-nickel (or tin-nickelcobalt) plating bath, such as by adding an additional nickel source (e.g., nickel fluoborate) or a stannous source (e.g., stannous fluoborate). Alternatively, the pH of the plating bath may require adjustment. In a preferred embodiment, the tin-nickel plating bath operates at a pH of 4.2–4.8, with an optimum pH of 4.5. If it becomes necessary to raise the pH of the plating bath, a buffer solution can be used. In this regard, the present invention envisions use of a buffer solution comprising an ethyleneamine mixture. In a preferred embodiment, the ethyleneamine mixture includes 5–50% diethylenetriamine, 5–50% triethylenetetramine; and 0.1–10% ammonium carbonate.

Additionally, it may become necessary to replenish the tin-nickel plating bath to maintain desired plating brightness and throwing power, that is, the ability to plate tin-nickel at a uniform thickness with a wide current density range required for high aspect ratio through hole plating of multilayer printed wiring boards. In this regard, the present invention includes, in one preferred embodiment, a replenisher solution consisting of 1–20% of a bifluoride salt, preferably ammonium bifluoride; and 1–10% of the above-described buffer mixture.

A concern associated with metal-based etch resist plating, in the context of printed circuit manufacturing, is the hardness or ductility of the plated material. As previously described, the etch resistant material, whether solder, tin, tin-nickel, etc., functions during the etching process to "protect" the copper-based circuitry traces from being removed with the exposed copper foil (as shown in FIGS. 2E and 2F). The etching process, in which the etchant solution is brought into contact with the board, is somewhat difficult to precisely control, such that, on some occasions, the copper-based sidewalls of the circuitry pattern (18 in FIGS. 2E and 2F) are attacked by the etchant, resulting in the copper beneath the etch resistant material (22 in FIGS. 2E and 2F) being removed. This phenomenon is generally referred to as "over-etching". When over-etching occurs, a portion of the etch resistant material (22 in FIGS. 2E and 2F) will overhang the remaining copper trace (14 and 20 in FIGS. 2E and 2F). Depending upon the characteristics of the etch resistant material, the overhang may create potential problems.

More particularly, where the etch resistant material is hard, and not ductile, it is not uncommon for the overhang portion to break off or "splinter". These splinters can become embedded in the board, requiring expensive reworking activities to remove the splinter, or even board failure. Therefore, any efforts to reduce etch resistant material hardness and increase ductility is of great importance.

In light of the above, an alternative embodiment of the present invention includes a bath additive for reducing material hardness and increasing ductility of the electroplated tin-nickel or tin-nickel-cobalt. The bath additive is silicone glycol copolymer-based. Preferably, the bath additive includes silicone polyethylene glycol (available, for example, from Witco of Friendly, W.V.), although any silicone glycol copolymer may be used, such as Harcross Chemicals AF-100 and AF-6050 Series. For example, a bath additive consisting of 10–50 g/l of boric acid and 1–10 mls/l of silicone polyethylene glycol was added to the above-described tin-nickel plating bath. The resulting electroplated tin-nickel material (run at a temperature of 150–170° F.) had a hardness of 150–170 on the Knoop scale of hardness. A typical tin-nickel electroplated material, such as that described in U.S. Pat. No. 3,772,168 to Dillenberg, the teachings of which are incorporated herein by reference, has a hardness of 400–480 on the Knoop scale of hardness. The large decrease in hardness achieved with the bath additive of the present invention, and resulting dramatic change in ductility, virtually eliminates the potential for splintering.

Prior to submersing a board or boards within the tin-nickel (or tin-nickel-cobalt) plating bath, the board is preferably subjected to various preparatory steps. More particularly, in the preferred embodiment, the board is immersed in a 10% by volume solution of hydrochloric acid and water for five minutes at ambient temperature. The board(s) is then rinsed in a continuously flowing deionized water rinse for five minutes at ambient temperature. The board(s) is then placed in a pre-plating solution consisting of 80% water and 20% plating starter solution (as described above). Following the pre-dip procedure, the board is placed into the tin-nickel plating bath for subsequent plating.

It should be recognized that the above-described tin-nickel plating bath, including the various starter, buffer and replenisher solutions, is but one preferred embodiment. In other words, the tin-nickel plating process of the present invention can be practiced with other tin-nickel plating solutions. For example, a tin-nickel alloy plating electrolyte using stannous salt, a nickel salt and an alkali-metal pyrophosphate, chloride, fluoride, bromide, sulfate or sulfumate may also be used. An example of such an electrolyte is provided in U.S. Pat. No. 3,887,444, the teachings of which are incorporated herein by reference. Other acceptable tin-nickel plating solutions include that described, at least in part, in, for example, U.S. Pat. Nos. 3,772,168; 3,887,444; 4,033,835; 4,049,508 and 4,828,657.

The tin-nickel electroplating process for fabrication of a printed circuit of the present invention presents numerous advantages over prior art manufacturing techniques. In particular, by replacing the tin or tin-lead electroplating step in the pattern-plated hard board or other printed circuit assembly process with a tin-nickel deposit, numerous steps, wastes and associated costs are eliminated. For example, there is no need to strip tin and/or solder. Further, there is no need to condition solder or make use of a hot oil or infrared reflow. Additionally, hot air leveling is eliminated, along with the associated thermal shock. Finally, because the desired circuitry pattern has already been plated with a nickel alloy, gold can easily be plated to desired areas of the board without requiring an additional nickel/plating step. Notably, with the preferred tin-nickel plating bath, the electroplating process does not result in free hydrofluoric acid. The process exhibits excellent throwing power, resulting in a near-perfect 1:1 hole aspect ratio, for superior through hole control and solder wetting. It has been found that the deposited tin-nickel alloy exhibits a very low coefficient of friction, excellent wear resistance, and can be used as a substitute for gold electroplating in many applications.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. A method for manufacturing a printed circuit, the method comprising:
   providing a board defined by a substrate having at least one surface coated with copper material;
   printing a circuitry pattern onto the copper-coated surface of the board such that the circuitry pattern is defined by exposed portions of the copper-coated surface, and the remainder of the copper-coated surface is covered with a resist material;
   plating a tin-nickel material onto the exposed copper surface such that a resulting tin-nickel material deposit maintains long-term solderability independent of other coatings;
   stripping the resist material; and
   etching the copper surface not otherwise plated with the tin-nickel material.

2. The method of claim 1, further including:
   plating an additional layer of copper onto the exposed copper-coated surface prior to plating the tin-nickel material.

3. The method of claim 1, further including:
   depositing a tin coating along side walls of the circuitry pattern after etching the copper surface.

4. The method of claim 1, further including:
   applying a solder mask to the board after etching the copper surface.

5. The method of claim 1, further including:
   plating a gold material to a surface of the tin-nickel material.

6. The method of claim 1, wherein plating a tin-nickel material does not produce hydrofluoric acid.

7. The method of claim 1, wherein plating a tin-nickel material includes:
depositing a coating comprised of 20–50% nickel and 50–80% tin.

8. The method of claim 7, wherein the coating is 35% nickel and 65% tin.

9. The method of claim 1, wherein plating a tin-nickel material includes plating a tin-nickel-cobalt material.

10. The method of claim 1, wherein plating a tin-nickel material includes:
depositing a coating comprised of 10–25% nickel, 10–25% cobalt and 50–80% tin.

11. The method of claim 1, wherein the tin-nickel plating is conducted in a solution having a pH of not less than 4.2.

12. The method of claim 1, wherein the tin-nickel plating occurs within a tin-nickel bath containing a nickel source selected from the group consisting of nickel fluoborate, nickel chloride, nickel bromide, nickel fluoride, nickel sulfate, nickel sulfamate, nickel carbonate and nickel pyrophosphate.

13. The method of claim 1, wherein the tin-nickel plating occurs within a bath containing a bifluoride salt, diethylenetriamine and triethylenetetramine.

14. The method of claim 1, wherein the tin-nickel plating occurs within a bath containing a silicone glycol copolymer.

15. The method of claim 1, wherein plating a tin-nickel material includes:
creating a tin-nickel material deposit having a hardness in the range of 150–170 on the Knoop scale of hardness.

* * * * *

UNITED STATES PATENT AND TRADEMARK OFFICE
CERTIFICATE OF CORRECTION

PATENT NO. : 6,015,482
DATED : January 18, 2000
INVENTOR(S) : Theodore R. Stern

It is certified that error appears in the above-identified patent and that said Letters Patent is hereby corrected as shown below:

Column 4,
Line 36, delete "2II" and insert therefor -- 2H --.

Column 8,
Line 45, delete "tin-nickelcolbalt" and insert therfor -- tin-nickel-cobalt --.

Signed and Sealed this

Twenty-fifth Day of December, 2001

Attest:

JAMES E. ROGAN
Attesting Officer
Director of the United States Patent and Trademark Office